United States Patent
Miller et al.

(10) Patent No.: US 9,449,440 B2
(45) Date of Patent: Sep. 20, 2016

(54) WIRELESS CRASH SURVIVABLE MEMORY UNIT

(71) Applicant: Honeywell International Inc., Morristown, NJ (US)

(72) Inventors: David Lowell Miller, Kirkland, WA (US); Gary Kersten, Duvall, WA (US); Karim Farraj, Kirkland, WA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/489,056

(22) Filed: Sep. 17, 2014

(65) Prior Publication Data

US 2016/0078693 A1   Mar. 17, 2016

(51) Int. Cl.
*H04B 5/00* (2006.01)
*G07C 5/08* (2006.01)
*H01Q 1/40* (2006.01)
(Continued)

(52) U.S. Cl.
CPC ............... *G07C 5/085* (2013.01); *H01Q 1/24* (2013.01); *H01Q 1/28* (2013.01); *H01Q 1/40* (2013.01); *H04B 5/0037* (2013.01); *H04B 5/0062* (2013.01)

(58) Field of Classification Search
CPC .......... G07C 5/085; H01Q 1/40; H01Q 1/24; H01Q 1/28; H04B 5/0037; H04B 5/0062
USPC ....................................... 455/41.1, 3.06, 431
See application file for complete search history.

(56) References Cited

U.S. PATENT DOCUMENTS

| | | |
|---|---|---|
| 4,428,998 A | 1/1984 | Hawkinson |
| 4,446,916 A | 5/1984 | Hayes |
| 4,600,449 A | 7/1986 | White et al. |

(Continued)

FOREIGN PATENT DOCUMENTS

| | | |
|---|---|---|
| EP | 1566263 | 8/2005 |
| EP | 2151907 | 2/2010 |

(Continued)

OTHER PUBLICATIONS

European Patent Office, "Communication Under Rule 71(3) from EP Application No. 13174592.9 mailed Jul. 2, 2015", From Foreign Counterpart of U.S. Appl. No. 13/552,243, Jul. 2, 2015, pp. 1-24, Published in: EP.

(Continued)

*Primary Examiner* — Marceau Milord
(74) *Attorney, Agent, or Firm* — Fogg & Powers LLC

(57) ABSTRACT

A recorder for a vehicle comprises a crash survivable memory unit, which includes a first antenna assembly including a first resonant element configured for near field data communications and to receive near field power transmissions, and a crash protected memory assembly that operatively communicates with the first antenna assembly. One or more protective layers surround the first antenna assembly and the memory assembly. A second antenna assembly is external to the crash survivable memory unit. The second antenna assembly includes a second resonant element, which is configured for near field data communications with the first resonant element and for near field power transmissions to the first resonant element. The second antenna assembly is adapted to receive information related to vehicle operations and to configure the information for wireless transmission to the first antenna assembly for recording in the memory assembly.

20 Claims, 2 Drawing Sheets

(51) Int. Cl.
*H01Q 1/24* (2006.01)
*H01Q 1/28* (2006.01)

(56) References Cited

U.S. PATENT DOCUMENTS

| | | | |
|---|---|---|---|
| 4,944,401 | A | 7/1990 | Groenewegen |
| 5,123,538 | A | 6/1992 | Groenewegen |
| 5,438,162 | A | 8/1995 | Thompson et al. |
| 5,708,565 | A | 1/1998 | Fairbanks |
| 5,760,336 | A | 6/1998 | Wang |
| 5,859,765 | A * | 1/1999 | Grewe .................. B64D 45/00 174/541 |
| 5,932,839 | A | 8/1999 | Ren et al. |
| 6,040,526 | A | 3/2000 | Olzak |
| 6,078,011 | A | 6/2000 | Ren et al. |
| 6,184,464 | B1 * | 2/2001 | Liptak .................. H02H 9/042 174/521 |
| 6,741,896 | B1 | 5/2004 | Olzak et al. |
| 6,899,161 | B2 | 5/2005 | Ren et al. |
| 7,382,959 | B1 | 6/2008 | Jacobsen |
| 7,653,276 | B1 | 1/2010 | Gross et al. |
| 7,875,812 | B2 * | 1/2011 | Steffler ................ H05K 5/0213 174/541 |
| 8,089,807 | B1 | 1/2012 | Steffler |
| 8,155,496 | B1 * | 4/2012 | Cumberland ......... F41H 5/0414 385/147 |
| 8,165,730 | B2 | 4/2012 | Winterhalter et al. |
| 8,723,057 | B2 * | 5/2014 | Miller .................. H05K 5/0213 174/524 |
| 8,859,063 | B2 * | 10/2014 | Miller .................. H05K 5/0213 428/34.4 |
| 2007/0072639 | A1 | 3/2007 | Frost et al. |
| 2009/0189617 | A1 | 7/2009 | Burns et al. |
| 2010/0250058 | A1 | 9/2010 | Steffler |
| 2011/0195363 | A1 * | 8/2011 | Rock .................... G03F 7/2022 430/325 |
| 2014/0020878 | A1 | 1/2014 | Miller et al. |
| 2014/0022722 | A1 | 1/2014 | Miller et al. |
| 2014/0141715 | A1 | 5/2014 | Smith |

FOREIGN PATENT DOCUMENTS

| | | |
|---|---|---|
| WO | 9923860 | 5/1999 |
| WO | 2007041091 | 4/2007 |
| WO | 2010114663 | 10/2010 |

OTHER PUBLICATIONS

European Patent Office, EP Search Report from EP Application No. 13174592.9 mailed Dec. 22, 2014, from Foreign Counterpart of U.S. Appl. No. 13/552,243, Dec. 22, 2014, pp. 1-3, Published in: EP.
U.S. Patent and Trademark Office, "Office Action", from U.S. Appl. No. 13/552,243, Feb. 14, 2014, pp. 1-22, Published in: US.
U.S. Patent and Trademark Office, "Restriction Requirement", from U.S. Appl. No. 13/552,243, Jan. 2, 2014, pp. 1-7, Published in: US.
U.S. Patent and Trademark Office, "Notice of Allowance and Fee(s) Due", Dec. 24, 2013, pp. 1-12, Published in: US.
U.S. Patent and Trademark Office, "Notice of Allowance", from U.S. Appl. No. 13/552,275, Mar. 20, 2014, pp. 1-11, Published in: US.
U.S. Patent and Trademark Office, "Office Action", from U.S. Appl. No. 13/552,275, Nov. 8, 2013, pp. 1-11, Published in: US.
Aspen Aerogels, Inc., "Pyrogel XTF Data Sheet", 2010, pp. 1-2, Publisher: Aspen Aerogels, Inc.
"Flight Autonomous Event Recorder Information Technology Open (FAERITO) Digital Data Download (D3)", [Abstract only], Feb. 4, 2002-Aug. 4, 2004, pp. 1-3, Publisher: Physical Optics Corporation.
Shankland, "Breakthrough Material is Barely More Than Air", Nov. 18, 2011, pp. 1-3, Publisher: http://news.cnet.com/8301-30685_3-57327382264/breakthrough-material-is-barely-more-than-air/ Dec. 2, 2011 11:32:01 AM.
European Patent Office, Office Action from EP Application No. 13174592.9 mailed Jan. 26, 2015, from Foreign Counterpart of U.S. Appl. No. 13/552,243, Jan. 26, 2015, pp. 1-4, Published in: EP.
European Patent Office, "Extended European Search Report from EP Application No. 15185559.0 mailed Feb. 17, 2016", from Foreign Counterpart of U.S. Appl. No. 14/489,056, Feb. 17, 2016, pp. 1-9, Published in: EP.
Paret, "RFID and Contactless Smart Card Applications", pp. 5-6, Publisher: John Wiley & Sons Ltd, Published in: US.
U.S. Patent and Trademark Office, Office Action, U.S. Appl. No. 14/457,992, Mar. 29, 2016, pp. 1-38.

* cited by examiner

WIRELESS CRASH SURVIVABLE MEMORY UNIT

BACKGROUND

In vehicle recorders, a crash survivable memory unit is utilized that requires extreme mechanical robustness, along with the ability to survive in an environment of extreme thermal energy for a limited duration. Current crash survivable memory unit designs rely on electronic circuits for communication with a solid-state storage medium within a highly insulated enclosure. The electrically conductive elements of such communication circuits pass through the protective enclosure and are highly thermally conductive. Despite efforts to minimize the conductive cross-section of these communication circuits, such circuits still provide a significant path of thermal ingress, partially bypassing the insulative material of the enclosure.

SUMMARY

A recorder for a vehicle comprises a crash survivable memory unit, which includes a first antenna assembly including a first resonant element configured for near field data communications and to receive near field power transmissions, and a crash protected memory assembly that operatively communicates with the first antenna assembly. One or more protective layers surround the first antenna assembly and the memory assembly. A second antenna assembly is external to the crash survivable memory unit. The second antenna assembly includes a second resonant element, which is configured for near field data communications with the first resonant element and for near field power transmissions to the first resonant element. The second antenna assembly is adapted to receive information related to vehicle operations and to configure the information for wireless transmission to the first antenna assembly for recording in the memory assembly.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A wireless crash survivable memory unit (CSMU) for a vehicle recorder is provided. The wireless CSMU is configured for wireless power transmissions and wireless data communications for recording vehicle operation data. The wireless CSMU is designed to withstand the extreme environment present during a vehicle crash.

In various embodiments, a wireless electromagnetic connection using near field communication techniques is employed. This removes the thermal path and significantly increases the overall thermal insulation of the enclosure of the CSMU. In addition, the present system is designed to limit electromagnetic emissions outside the area of a wireless communication link. The present approach departs from conventional designs by increasing the thermal protection of the data storage device with a continuous insulative layer, while reducing the weight and size of the recorder, to provide more environmental resilience and improved crash protection.

In one embodiment, antenna and transceiver circuitry external to the CSMU communicates wirelessly via radio frequency (RF) electromagnetic near field communication with antenna and transceiver circuitry within the insulated enclosure of the CSMU. The external transceiver circuitry is configured to transmit power, as well as transmit and receive data. The internal transceiver circuitry is configured to receive power and convert it for use by other circuitry within the CSMU, as well as communicate with a protected memory device. An outer protective armor layer of the CSMU is permeable to the relevant electromagnetic spectrum.

The present CSMU can be implemented in various vehicle recorders, such as the crash recorders employed in aircraft, trucks, locomotives, ships, military vehicles, spacecraft, and the like.

Further details of various embodiments are described hereafter with reference to the drawings.

Figure 1:
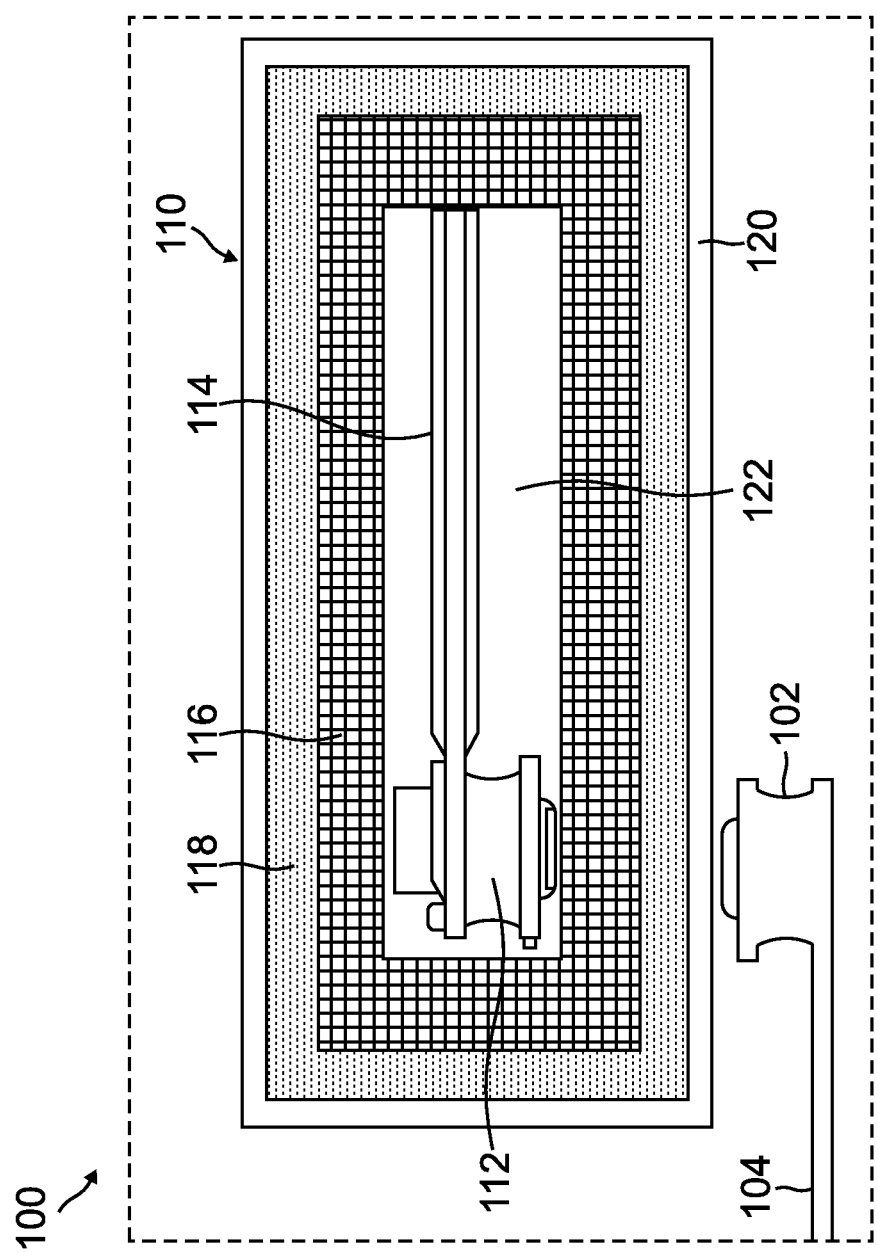
FIG. 1 is a partial cross-sectional view of a vehicle recorder according to one embodiment.

FIG. 1 illustrates a vehicle recorder 100 according to one embodiment. The recorder 100 is an electronic device that records instructions sent to electronic systems on the vehicle. In one exemplary implementation, recorder 100 can be a flight recorder and can include one or more of a flight data recorder, a cockpit voice recorder, an image recorder, a datalink recorder, and the like. In some implementations, recorder 100 can record audio and/or video images in certain locations of the vehicle, such as an aircraft cockpit.

The recorder 100 includes an external antenna assembly 102, and a wireless crash survivable memory unit (CSMU) 110. The external antenna assembly 102 is in operative, wireless communication with an internal antenna assembly 112 in CSMU 110. In one embodiment, external antenna assembly 102 includes an RF antenna, a near field communication (NFC) power transmitter, and a data communication transceiver. The internal antenna assembly 112 includes various components for wireless communication with external antenna assembly 102. In one embodiment, internal antenna assembly 112 includes an RF antenna, an NFC power receiver/converter, and a data communication transceiver.

The external antenna assembly 102 can interface with various vehicle systems through a communication cable 104, such as a flexprint cable, a co-axial cable, a fiber optic cable, or the like. The communication cable 104 can receive information describing the commands transmitted to different electronic systems on the vehicle, can receive audio information related to conversations between a vehicle crew and other ambient sounds in the vehicle, can receive video information from the vehicle, or other vehicle operation information. The information received by communication cable 104 is transmitted to external antenna assembly 102, which configures the information for wireless transmission to internal antenna assembly 112 in CSMU 110.

The CSMU 110 includes a crash protected memory assembly 114 in operative communication with internal antenna assembly 112. The memory assembly 114 includes a computer or processor readable medium that stores data for future retrieval. For example, memory assembly 114 can store data on a solid state memory device, or the like.

In order to preserve data that has been recorded in memory assembly 114, CSMU 110 is designed to withstand the extreme environment that can occur during vehicle crashes. To ensure that CSMU 110 is able to withstand such extreme environments, CSMU 110 includes various protective layers that function together to protect memory assembly 114 from being damaged by the shock and heat that occurs, for example, during an airplane crash.

In the exemplary embodiment shown in FIG. 1, memory assembly 114 can be surrounded by a heat absorption layer 116, which in turn is surrounded by a thermal insulation layer 118. In addition, an impact resistant protective armor layer 120 can completely surround memory assembly 114, heat absorption layer 116, and thermal insulation layer 118. The combination of the multiple layers of CSMU 110 protects memory assembly 114 from the extreme forces and heat that can occur during a vehicle crash. In other embodiments, more or fewer protection layers, and even a single homogenous protection layer, can be implemented.

In one embodiment, memory assembly 114 can be packed within a heat absorption material 122 that includes a phase change material, such as hydrocarbons, organic molecules, fatty acids, salt hydrates, bicarbonate of soda, or the like. In one implementation, heat absorption layer 116 can be a metallic microlattice layer in which truss elements provide a compressible scaffolding layer around memory assembly 114. This metallic microlattice layer can be impregnated with heat absorption material 122 that includes the phase change material. The metallic microlattice layer distributes heat throughout the heat absorption material to impede thermal energy from reaching memory assembly 114. An exemplary metallic microlattice layer for use in crash survivable memory units is described in further detail in U.S. Pat. No. 8,723,057, the disclosure of which is incorporated herein by reference.

The thermal insulation layer 118 inhibits the transfer of heat to heat absorption layer 116. The heat that does get transferred through thermal insulation layer 118 is absorbed by heat absorption layer 116. The thermal insulation layer 118 and heat absorption layer 116 function together to inhibit heat in the environment of CSMU 110 from damaging memory assembly 114. Further, thermal insulation layer 118 and heat absorption layer 116 function together to prevent shocks to CSMU 110 from damaging memory assembly 114.

In one implementation, thermal insulation layer 118 can include a flexible aerogel that surrounds heat absorption layer 116. The flexible aerogel impedes the transfer of heat from the external layers of CSMU 110 to the inner layers surrounding memory assembly 114.

The heat absorption layer 116 and thermal insulation layer 118 can also be deformable and able to move in response to shocks. This allows both heat absorption layer 116 and thermal insulation layer 118 to absorb the energy produced by shocks applied to CSMU 110, thereby preventing shock damage to memory assembly 114.

The protective armor layer 120 is composed of a material permeable to RF or near field communications while being impact resistant, such as a non-ferro-magnetic metal, a composite material, or the like. In one embodiment, protective armor layer 120 can be hermetically sealed while being transparent to RF or near field communications. In one embodiment, at least a portion of protective armor layer 120 is transparent to near field transmissions in the area where internal antenna assembly 112 is in wireless communication with external antenna assembly 102. The protective armor layer 120 can also withstand impacts at the high forces present in an aircraft crash without breaching.

Figure 2:
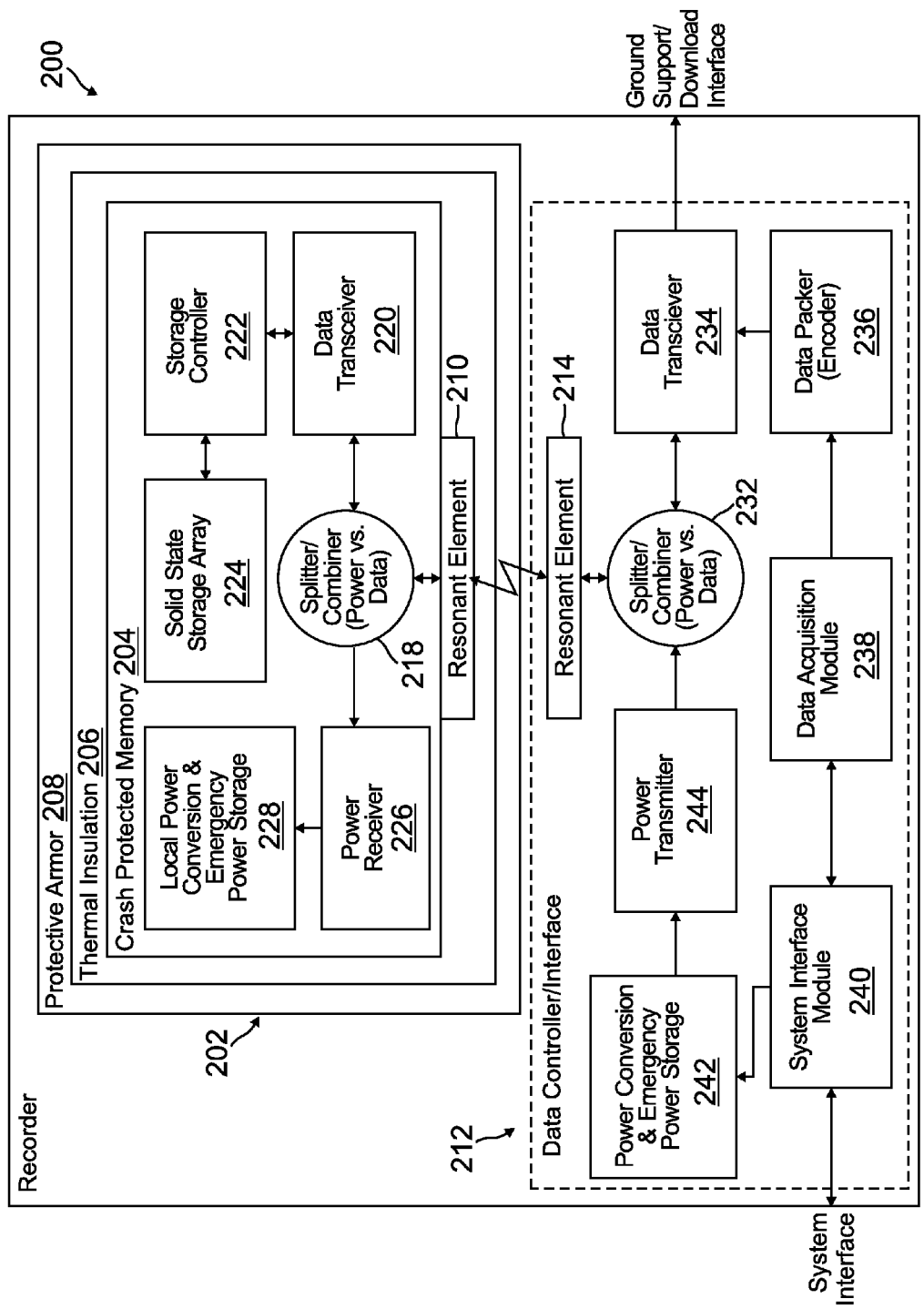
FIG. 2 is a block diagram depicting various functional components of a vehicle recorder according to one embodiment.

FIG. 2 is a block diagram of a vehicle recorder 200, such as a flight recorder for an aircraft, and shows various functional components according to one embodiment. The recorder 200 generally includes a wireless crash survivable memory unit (CSMU) 202, which operatively communicates with a data controller/interface 212. The CSMU 202 includes a plurality of protective layers surrounding a crash protected memory assembly 204 that can be embedded in a heat absorption material. A thermal insulation layer 206 surrounds memory assembly 204, and an impact resistant armor layer 208 surrounds thermal insulation layer 206 and memory assembly 204. Additional protective layers and materials for CSMU 202 may be implemented in other embodiments, which may include the various protective layers and materials described with respect to FIG. 1.

The CSMU 202 also includes a first resonant element 210, such as an antenna element, a resonant inductor, a capacitor, or the like. The first resonant element 210 is configured for wireless communicative coupling with a second resonant element 214 that is external to CSMU 202 and located in data controller/interface 212. The wireless communicative coupling between first and second resonant elements 210 and 214 can accomplished using near field communication techniques, such as direct induction, resonant magnetic induction, electrostatic induction, electromagnetic radiation, and the like. The second resonant element 214 can correspondingly be an antenna element, a resonant inductor, a capacitor, or the like.

The first resonant element 210 operatively communicates with a first splitter/combiner 218 (or modulator/demodulator) in memory assembly 204. The splitter/combiner 218 is configured for both power and data transmissions. A first near field data transceiver 220 in memory assembly 204 operatively communicates with splitter/combiner 218 to receive data communications. A storage controller 222 in memory assembly 204 operatively communicates with data transceiver 220 to process the data communications for storage. The storage controller can include a microprocessor, a microcontroller, a state machine, or the like. A solid state storage array 224 in memory assembly 204 operatively communicates with storage controller 222 and is configured to permanently store the received vehicle operation information.

A near field power receiver 226 in memory assembly 204 is configured to receive power transmissions from splitter/combiner 218. A local power conversion module 228 in memory assembly 204 is operative to receive a power signal from power receiver 226. The power conversion module 228 also includes emergency power storage, which supplies power to memory assembly 204 to allow one or more active operations to be completed when there is a vehicle power failure, for example.

The second resonant element 214 operatively communicates with various components in data controller/interface 212. As shown in FIG. 2, resonant element 214 is in operative communication with a second splitter/combiner 232, which is configured for both power and data transmissions. A second near field data transceiver 234 operatively communicates with splitter/combiner 232 and a ground support/download interface. The data transceiver 234 is configured to receive data from a data packer or encoder 236, which packetizes and serializes data for transmission to memory assembly 204. The data transceiver 234 formats the serialized data for transmission over communicative links.

The data packer or encoder 236 receives data from a data acquisition module 238, which collects data to be recorded from one or more data interfaces. In one embodiment, data acquisition module 238 is in operative communication with a system interface module 240, which operatively communicates with an aircraft system interface. A power conversion module 242 is in operative communication with system interface module 240 and includes an emergency power storage, which supplies power to tolerate short power interruptions. A near field power transmitter 244 receives a power signal from power conversion module 242 and transmits the power signal to splitter/combiner 232 for transmission to CSMU 202.

A computer or processor used in the present systems and methods can be implemented using software, firmware, hardware, or any appropriate combination thereof, as known to one of skill in the art. These may be supplemented by, or incorporated in, specially-designed application-specific integrated circuits (ASICs) or field programmable gate arrays (FPGAs). The computer or processor can also include functions with software programs, firmware, or other computer readable instructions for carrying out various process tasks, calculations, and control functions used in the present method and system.

Instructions for carrying out the various process tasks, calculations, and generation of other data used in the operation of the methods described herein can be implemented in software, firmware, or other computer- or processor-readable instructions. These instructions are typically stored on any appropriate computer program product that includes a computer readable medium used for storage of computer readable instructions or data structures. Such a computer readable medium can be any available media that can be accessed by a general purpose or special purpose computer or processor, or any programmable logic device.

Suitable processor-readable media may include storage or memory media such as magnetic or optical media. For example, storage or memory media may include conventional hard disks, or optical storage disks; volatile or non-volatile media such as Random Access Memory (RAM); Read Only Memory (ROM), Electrically Erasable Programmable ROM (EEPROM), flash memory, and the like; or any other media that can be used to carry or store desired program code in the form of computer executable instructions or data structures.

Example Embodiments

Example 1 includes a recorder for a vehicle, comprising: a crash survivable memory unit comprising a first antenna assembly including a first resonant element configured for near field data communications and to receive near field power transmissions, a crash protected memory assembly that operatively communicates with the first antenna assembly, and one or more protective layers surrounding the first antenna assembly and the memory assembly; a second antenna assembly that is external to the crash survivable memory unit, the second antenna assembly including a second resonant element configured for near field data communications with the first resonant element and for near field power transmissions to the first resonant element. The second antenna assembly is adapted to receive information related to vehicle operations and to configure the information for wireless transmission to the first antenna assembly for recording in the memory assembly.

Example 2 includes the recorder of Example 1, wherein the first antenna assembly further includes a near field power receiver and a near field data transceiver that are in operative communication with the first resonant element.

Example 3 includes the recorder of any of Example 1-2, wherein the first resonant element comprises an antenna element, a resonant inductor, or a capacitor.

Example 4 includes the recorder of any of Examples 2-3, wherein the second antenna assembly further includes a near field power transmitter and a near field data transceiver that are in operative communication with the second resonant element.

Example 5 includes the recorder of any of Examples 1-4, wherein the second resonant element comprises an antenna element, a resonant inductor, or a capacitor.

Example 6 includes the recorder of any of Examples 1-5, wherein wireless communicative coupling between the first and second resonant elements is carried out with near field communication techniques comprising direct induction, resonant magnetic induction, electrostatic induction, or electromagnetic radiation.

Example 7 includes the recorder of any of Examples 1-6, wherein the protective layers comprise a heat absorption layer that surrounds the memory assembly, a thermal insulation layer that surrounds the heat absorption layer, and an impact resistant protective armor layer that surrounds the thermal insulation layer.

Example 8 includes the recorder of Example 7, wherein the heat absorption layer includes a metallic microlattice layer, and a phase change material.

Example 9 includes the recorder of any of Examples 7-8, wherein the thermal insulation layer comprises a flexible aerogel.

Example 10 includes the recorder of any of Examples 7-9, wherein the protective armor layer comprises a non-ferromagnetic metal or a composite material.

Example 11 includes a flight recorder for an aircraft, comprising: a crash survivable memory unit comprising a crash protected memory assembly embedded in a heat absorption material; at least one thermal insulation layer that surrounds the embedded memory assembly; an impact resistant protective armor layer that surrounds the at least one thermal insulation layer and the memory assembly, wherein at least a portion of the protective armor layer is transparent to near field transmissions; a first resonant element in operative communication with the memory assembly, the first resonant element configured for near field data communications and to receive near field power transmissions; a first splitter/combiner that operatively communicates with the first resonant element for power and data transmissions; a first data transceiver that operatively communicates with the first splitter/combiner; a power receiver configured to receive power transmissions from the first splitter/combiner; and a solid state storage array in the memory assembly that operatively communicates with the first data transceiver. A second resonant element is external to the crash survivable memory unit and is configured for near field data communications with the first resonant element and for near field power transmissions to the first resonant element. A second splitter/combiner is external to the crash survivable memory unit and is in operative communication with the second resonant element for power and data transmissions. A second data transceiver is external to the crash survivable memory unit and is in operative communication with the second splitter/combiner. A power transmitter is external to the crash survivable memory unit and is configured to send a power signal to the second splitter/combiner for wireless transmission of the power signal to the crash survivable memory unit.

Example 12 includes the flight recorder of Example 11, further comprising a first power conversion module in the memory assembly and configured to receive a power signal from the power receiver, the first power conversion module including an emergency power storage that supplies power to the memory assembly to allow one or more active operations to be completed when there is an aircraft system power failure.

Example 13 includes the flight recorder of any of Examples 11-12, further comprising a storage controller in the memory assembly that operatively communicates with the first data transceiver and the solid state storage array.

Example 14 includes the flight recorder of any of Examples 11-13, further comprising a data packer or encoder external to the crash survivable memory unit that packetizes and serializes data for transmission to the memory assembly through the second data transceiver.

Example 15 includes the flight recorder of Example 14, wherein the data packer or encoder receives data from a data acquisition module that collects data to be recorded from one or more data interfaces.

Example 16 includes the flight recorder of Example 15, wherein the data acquisition module is in operative communication with a system interface module that operatively communicates with an aircraft system interface.

Example 17 includes the flight recorder of Example 16, further comprising a second power conversion module, external to the crash survivable memory unit, in operative communication with the system interface module and the power transmitter, the second power conversion module including an emergency power storage for aircraft system power interruptions of a short duration.

Example 18 includes the flight recorder of any of Examples 11-17, wherein the first and second resonant elements each comprise an antenna element, a resonant inductor, or a capacitor.

Example 19 includes the flight recorder of any of Examples 11-18, wherein the first and second resonant elements are configured for wireless communicative coupling using near field communication techniques comprising direct induction, resonant magnetic induction, electrostatic induction, or electromagnetic radiation.

Example 20 includes a crash survivable memory unit comprising: a crash protected memory assembly embedded in a heat absorption material; at least one thermal insulation layer that surrounds the embedded memory assembly; an impact resistant protective armor layer that surrounds the at least one thermal insulation layer and the memory assembly, wherein at least a portion of the protective armor layer is transparent to near field transmissions; a resonant element in operative communication with the memory assembly, the resonant element configured for near field data communications and to receive near field power transmissions; a splitter/combiner that operatively communicates with the resonant element for power and data transmissions; a near field data transceiver that operatively communicates with the splitter/combiner; a near field power receiver configured to receive near field power transmissions from the splitter/combiner; a storage controller in the memory assembly and in operative communication with the data transceiver; a solid state storage array in the memory assembly and in operative communication with the storage controller; and a local power conversion module in the memory assembly and configured to receive a power signal from the power receiver, the power conversion module including an emergency power storage that supplies power to the memory assembly to allow one or more active operations to be completed when there is a power failure.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A recorder for a vehicle, comprising:
    a crash survivable memory unit comprising:
        a first antenna assembly including a first resonant element configured for near field data communications and to receive near field power transmissions;
        a crash protected memory assembly that operatively communicates with the first antenna assembly; and
        one or more protective layers surrounding the first antenna assembly and the memory assembly;
    a second antenna assembly that is external to the crash survivable memory unit, the second antenna assembly including a second resonant element configured for near field data communications with the first resonant element and for near field power transmissions to the first resonant element;
    wherein the second antenna assembly is adapted to receive information related to vehicle operations and to configure the information for wireless transmission to the first antenna assembly for recording in the memory assembly.

2. The recorder of claim 1, wherein the first antenna assembly further includes a near field power receiver and a near field data transceiver that are in operative communication with the first resonant element.

3. The recorder of claim 2, wherein the first resonant element comprises an antenna element, a resonant inductor, or a capacitor.

4. The recorder of claim 2, wherein the second antenna assembly further includes a near field power transmitter and a near field data transceiver that are in operative communication with the second resonant element.

5. The recorder of claim 4, wherein the second resonant element comprises an antenna element, a resonant inductor, or a capacitor.

6. The recorder of claim 1, wherein wireless communicative coupling between the first and second resonant elements is carried out with near field communication techniques comprising direct induction, resonant magnetic induction, electrostatic induction, or electromagnetic radiation.

7. The recorder of claim 1, wherein the protective layers comprise:
    a heat absorption layer that surrounds the memory assembly;
    a thermal insulation layer that surrounds the heat absorption layer; and
    an impact resistant protective armor layer that surrounds the thermal insulation layer.

8. The recorder of claim 7, wherein the heat absorption layer includes a metallic microlattice layer, and a phase change material.

9. The recorder of claim 7, wherein the thermal insulation layer comprises a flexible aerogel.

10. The recorder of claim 7, wherein the protective armor layer comprises a non-ferro-magnetic metal or a composite material.

11. A flight recorder for an aircraft, comprising:
a crash survivable memory unit comprising:
a crash protected memory assembly embedded in a heat absorption material;
at least one thermal insulation layer that surrounds the embedded memory assembly;
an impact resistant protective armor layer that surrounds the at least one thermal insulation layer and the memory assembly, wherein at least a portion of the protective armor layer is transparent to near field transmissions;
a first resonant element in operative communication with the memory assembly, the first resonant element configured for near field data communications and to receive near field power transmissions;
a first splitter/combiner that operatively communicates with the first resonant element for power and data transmissions;
a first data transceiver that operatively communicates with the first splitter/combiner;
a power receiver configured to receive power transmissions from the first splitter/combiner; and
a solid state storage array in the memory assembly that operatively communicates with the first data transceiver;
a second resonant element that is external to the crash survivable memory unit, the second resonant element configured for near field data communications with the first resonant element and for near field power transmissions to the first resonant element;
a second splitter/combiner that is external to the crash survivable memory unit, the second splitter/combiner in operative communication with the second resonant element for power and data transmissions;
a second data transceiver that is external to the crash survivable memory unit, the second data transceiver in operative communication with the second splitter/combiner; and
a power transmitter that is external to the crash survivable memory unit, the power transmitter configured to send a power signal to the second splitter/combiner for wireless transmission of the power signal to the crash survivable memory unit.

12. The flight recorder of claim 11, further comprising a first power conversion module in the memory assembly and configured to receive a power signal from the power receiver, the first power conversion module including an emergency power storage that supplies power to the memory assembly to allow one or more active operations to be completed when there is an aircraft system power failure.

13. The flight recorder of claim 12, further comprising a storage controller in the memory assembly that operatively communicates with the first data transceiver and the solid state storage array.

14. The flight recorder of claim 13, further comprising a data packer or encoder external to the crash survivable memory unit that packetizes and serializes data for transmission to the memory assembly through the second data transceiver.

15. The flight recorder of claim 14, wherein the data packer or encoder receives data from a data acquisition module that collects data to be recorded from one or more data interfaces.

16. The flight recorder of claim 15, wherein the data acquisition module is in operative communication with a system interface module that operatively communicates with an aircraft system interface.

17. The flight recorder of claim 16, further comprising a second power conversion module, external to the crash survivable memory unit, in operative communication with the system interface module and the power transmitter, the second power conversion module including an emergency power storage for aircraft system power interruptions of a short duration.

18. The flight recorder of claim 11, wherein the first and second resonant elements each comprise an antenna element, a resonant inductor, or a capacitor.

19. The flight recorder of claim 11, wherein the first and second resonant elements are configured for wireless communicative coupling using near field communication techniques comprising direct induction, resonant magnetic induction, electrostatic induction, or electromagnetic radiation.

20. A crash survivable memory unit, comprising:
a crash protected memory assembly embedded in a heat absorption material;
at least one thermal insulation layer that surrounds the embedded memory assembly;
an impact resistant protective armor layer that surrounds the at least one thermal insulation layer and the memory assembly, wherein at least a portion of the protective armor layer is transparent to near field transmissions;
a resonant element in operative communication with the memory assembly, the resonant element configured for near field data communications and to receive near field power transmissions;
a splitter/combiner that operatively communicates with the resonant element for power and data transmissions;
a near field data transceiver that operatively communicates with the splitter/combiner;
a near field power receiver configured to receive near field power transmissions from the splitter/combiner;
a storage controller in the memory assembly and in operative communication with the data transceiver;
a solid state storage array in the memory assembly and in operative communication with the storage controller; and
a local power conversion module in the memory assembly and configured to receive a power signal from the power receiver, the power conversion module including an emergency power storage that supplies power to the memory assembly to allow one or more active operations to be completed when there is a power failure.

* * * * *